United States Patent [19]

Mitsuyu et al.

[11] Patent Number: 4,735,910
[45] Date of Patent: Apr. 5, 1988

[54] IN-SITU DOPING OF MBE GROWN II-VI COMPOUNDS ON A HOMO- OR HETERO-SUBSTRATE

[75] Inventors: Tsuneo Mitsuyu, Hirakata; Osamu Yamazaki, Toyonaka, both of Japan

[73] Assignee: Matsushita Electric Industrial Co., Ltd., Osaka, Japan

[21] Appl. No.: 906,460

[22] Filed: Sep. 12, 1986

[30] Foreign Application Priority Data

Sep. 19, 1985 [JP] Japan .................. 60-206827
Sep. 19, 1985 [JP] Japan .................. 60-206828
Nov. 15, 1985 [JP] Japan .................. 60-256916

[51] Int. Cl.$^4$ .................. H01L 21/265; H01L 21/363
[52] U.S. Cl. .................. 437/22; 437/28; 437/105; 437/126; 437/987
[58] Field of Search .................. 148/1.5, 174, 175; 29/576 B, 576 E, 569 L

[56] References Cited

U.S. PATENT DOCUMENTS

| | | | |
|---|---|---|---|
| 3,520,741 | 7/1970 | Mankarious | 148/1.5 |
| 4,086,108 | 4/1978 | Gonda | 148/175 |
| 4,392,453 | 7/1983 | Luscher | 148/175 |
| 4,566,918 | 1/1986 | Irvine et al. | 148/175 |
| 4,589,192 | 5/1986 | Dinan et al. | 29/576 E |

OTHER PUBLICATIONS

Yao et al., Appl. Phys. Lett., 48 (1986), 160.
Mach et al., Phys. Stat. Solidi (2a) [1970], 701.
Engel et al., in Ion Implantation in Semiconductors, ed. Chernow et al., Plenum, 1976, p. 663.
Shepherd et al., J. Vac. Sci. Technol. 18 (1981), 899.

Primary Examiner—Upendra Roy
Attorney, Agent, or Firm—Stevens, Davis, Miller & Mosher

[57] ABSTRACT

The present invention relates to a method of manufacturing semiconductors by as vacuum deposition process on various kinds of group II-VI compound semiconductors by irradiating onto the substrate an ion beam containing nitrogen or phosphorus or arsenic to obtain a p-type thin film crystal.

17 Claims, 2 Drawing Sheets

IN-SITU DOPING OF MBE GROWN II-VI COMPOUNDS ON A HOMO- OR HETERO-SUBSTRATE

BACKGROUND OF THE INVENTION

The present invention relates to a method of manufacturing a semiconductor material for use in light-emitting devices such as light-emitting diodes, laser diodes, and the like and, more particularly, to a method of manufacturing group II–VI compound semiconductors which present the p-type conduction.

The group II–VI compound semiconductors consisting of a group II element such as mercury (Hg), cadmium (Cd), zinc (Zn), or the like and a group VI element such as sulfer (S), selenium (Se), tellurium (Te), or the like are suitable as a material to constitute light-emitting devices such as light-emitting diodes, laser diodes, and the like. However, in group II–VI compound semiconductors, in general, it is difficult to obtain a crystal which presents p-type conduction, so that a pn-junction light-emitting device having a high efficiency has not been realized yet. Hitherto, as an attempt to obtain a group II–VI compound semiconductor of the p-type, there has been known the method whereby phosphorus (P) is doped as an impurity to realize the p-type in the step of the crystal growth by a molecular-beam epitaxy method (for example, refer to "Journal of Crystal Growth", Vol. 72, No. ½ (1985), pages 31–40). In this method, Zn, Se, and $Zn_3P_2$ are respectively heated and evaporated under vacuum, thereby forming a thin film of ZnSe crystal including P on the substrate.

However, according to such a conventional method, since the vapor pressure of P is high, P deposited on the substrate is reevaporated, so that a sufficient amount of P cannot be doped. Thus, it is impossible to produce a crystal which presents p-type conduction.

SUMMARY OF THE INVENTION

The present invention is made in consideration of the foregoing points and an object of the invention is to provide a method of manufacturing group II–VI compound semiconductors which present p-type conduction by effectively doping impurity.

To solve the foregoing problems, according to the invention, in the molecular-beam epitaxy method, atomic ions or molecular ions of nitrogen (N), phosphorus (P), or arsenic (As), or ions of molecules including atoms of either of these elements are irradiated onto the substrate surface onto which a thin film is being formed.

With this method, the reactivity of impurity atoms or molecules is much enhanced, so that the impurity is effectively doped without being reevaporated.

DESCRIPTION OF THE PREFERRED EMBODIMENTS

The present invention will be described in detail hereinbelow with respect to an embodiment.

Figure 1:
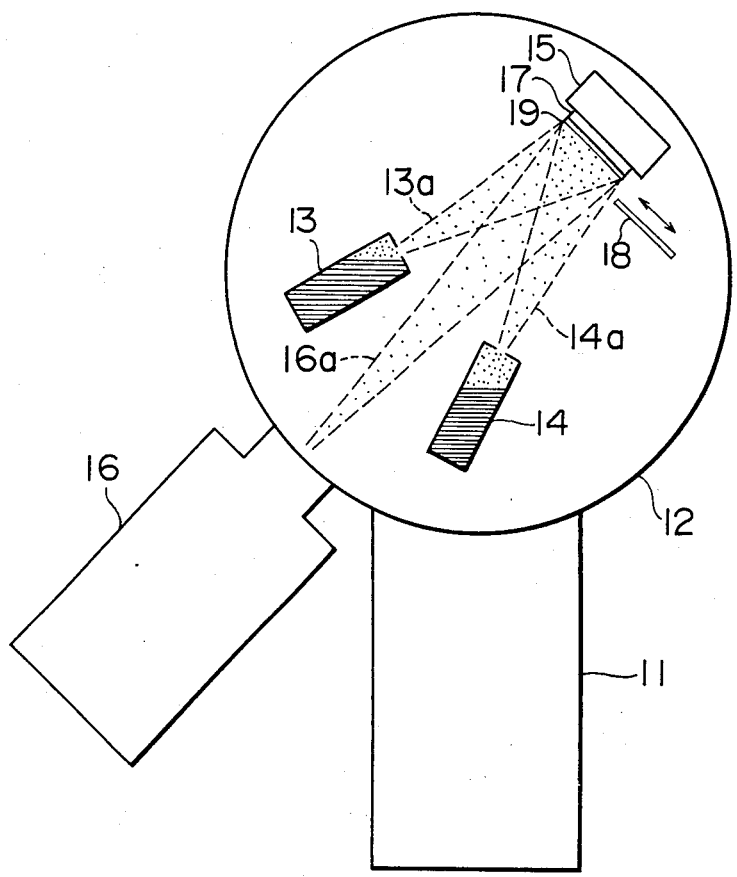
FIG. 1 is a schematic diagram showing a constitution of a molecular-beam epitaxy apparatus for use in the embodiment of the present invention.

In this embodiment, an explanation will now be made with respect to the case of manufacturing a thin-film crystal of zinc selenide (ZnSe) into which nitrogen (N) was doped as an impurity. The apparatus for use in manufacturing is fundamentally similar to the conventional molecular-beam epitaxy apparatus. Namely, this apparatus is a kind of vacuum deposition apparatus in which molecular-beam sources (evaporation crucibles) 13 and 14, and a substrate holder 15, are provided in a vacuum chamber 12 equipped with an ultra-high-vacuum pump 11 as shown in FIG. 1. In the case of this embodiment, in addition to those components, it is necessary to provide an ion gun 16 which can generate a nitrogen-ion beam 16a. The actual thin-film crystal growth is executed in accordance with the following procedure. First, Zn and Se of high purities as raw materials are respectively filled in the individual molecular-beam sources 13 and 14. A substrate 17 having a clean surface is attached to the substrate holder 15. As a material of the substrate, the gallium arsenide (GaAs) crystal having a crystal lattice constant near that of ZnSe is suitable. Next, the gases in the vacuum chamber are exhausted until an ultra-high vacuum of about below $10^{-9}$ Torr. Thereafter, each molecular-beam source is heated so as to obtain the proper molecular-beam intensity. The ratio of intensities of a Zn molecular-beam 13a and a Se molecular-beam 14a is set to, for example, about 1:1. (During this process, the substrate is barriered from the molecular beams by a shutter 18).

Next, the substrate 17 is heated to a temperature of about 600° C. and the surface is further cleaned. Thereafter, the substrate is cooled to a temperature suitable for crystal growth. In this case, it is set to, e.g., 350° C. Then, the shutter 18 is opened to start the crystal growth and the nitrogen-ion beam 16a is continuously irradiated onto the substrate 17 by the ion gun 16. It is desirable that the energy of ions which are used in this case is set to below 500 eV. In the case of the energy above 500 eV, a crystal 19 which is growing may be damaged, causing the characteristics to deteriorate. On the other hand, it is preferable that the ion concentration on the substrate surface is selected to fall within a range below 1/100 of the intensity of the molecular-beam which enters the substrate surface, namely, of the concentration of deposition atoms so as to give a desired doping amount of nitrogen. In case of ion concentration above 1/100, the doping amount may become excessive, causing the crystalline property to deteriorate.

Figure 2:
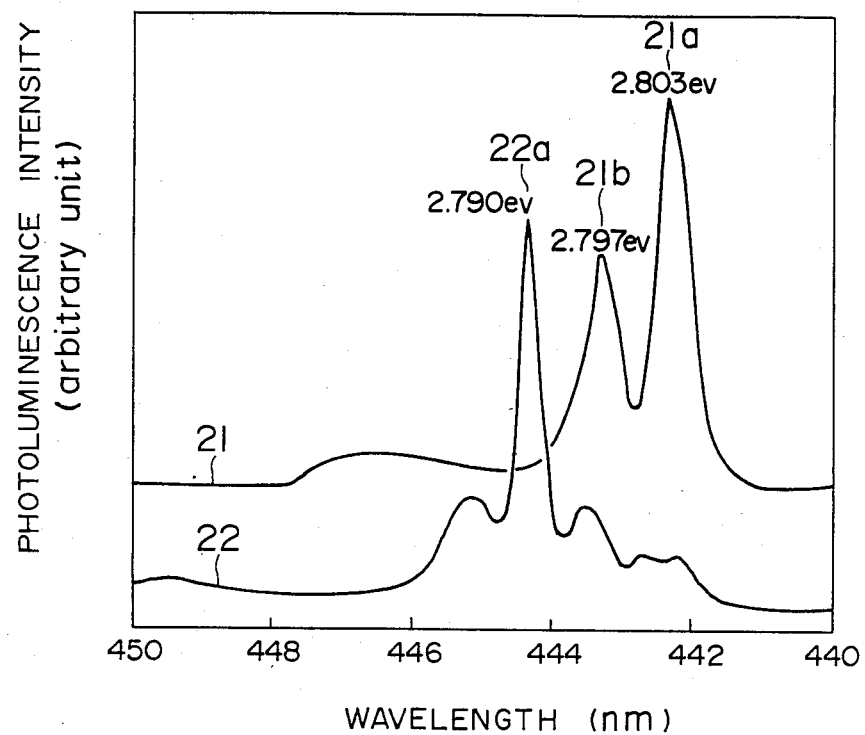
FIG. 2 is a low-temperature photoluminescence spectral diagram of the nitrogen-doped ZnSe Semiconductor obtained by the embodiment of the invention and of an undoped ZnSe semiconductor for comparison.

FIG. 2 shows a low temperature (4.2° K.) photoluminescence spectrum of the nitrogen-doped ZnSe thin-film crystal which was produced by the foregoing method. This diagram also shows the result in the undoped case where no ion beam is irradiated for comparison. When no nitrogen is doped (indicated by numeral 21), a free excition emission 21a having a peak at 2.803 eV and a donor bound-exciton emission 21b having a peak at 2.797 eV are typical. Therefore, it will be understood that the n-type conduction occurs due to the residual donor impurity. On the other hand, in the case where nitrogen was doped (22 in the diagram), a typical peak 22a newly appears at 2.790 eV. This denotes the light emission of the excitons bound to shallow acceptors. Therefore, it will be understood that nitrogen is effectively led in as acceptors and p-type conduction occurs. As mentioned above, the reason why nitrogen is effectively led in by the irradiation of the ion beam is because it is considered that the reactivity is much enhanced since nitrogen has been ionized, so that the deposited atoms are taken into the ZnSe cystal without being reevaporated.

The nitrogen ions which are used in this embodiment may be any of the nitrogen atoms ions ($N^+$) and nitrogen molecular ions ($N_2^+$), or may be the ions of the molecules containing the nitrogen atoms such as ammonia ($NH_3$) or the mixed ions thereof. All of the incident beams are not necessarily formed of the ions but may also include neutral particles.

Although GaAs, which is easy to obtain as a substrate material, was used in the embodiment, the monocrystal of ZnSe itself may be also used. In this case, the monocrystal is advantageous because there is no risk of occurrence of a lattice defect by lattice mismatch between the substrate and the thin-film crystal. In addition, in the case of using the GaAs substrate, as a method of suppressing the occurrence of a lattice defect, the method can be considered whereby instead of ZnSe, the compositions of the thin-film crystal are $ZnS_xSE_{1-x}$ in which a part of the Se atoms were replaced by sulfur (S). In this case, by setting the proper composition ratio x (about 0.05), the lattice constant coincides with that of GaAs and no lattice defect occurs. This method is extremely effective in practice since a large-sized monocrystal of GaAs of good quality can be easily obtained.

Although the foregoing embodiment relates to the case of producing ZnSe or $ZnS_xSE_{1-x}$ into which nitrogen was doped, the method of the invention can be also similarly applied to other group II–VI compound semiconductors. Namely, the invention can be also applied to the group II–VI compound semiconductors (also including three-component mixed crystal such as $ZNS_xTE_{1-x}$ or multi-component mixed crystal consisting of three components or more) of an arbitrary combination selected from the groups consisting of a group II element of mercury or cadmium or zinc and a group VI element of sulfur or selenium or tellurium. In addition to nitrogen, it is also possible to similarly use phosphorus or arsenic as an impurity to be doped. In this case, as well as the simple ions, the molecular ions such as phosphine ($PH_3$), arsine ($AsH_3$), or the like are used.

As described above, according to the present invention, the group II–VI compound semiconductor crystal into which an acceptor impurity was effectively doped can be obtained and p-type conduction which has conventionally been difficult to be realized is accomplished. Thus, a pn-junction light-emitting device of a high efficiency can be realized. The invention is very useful in practice.

We claim:

1. A method of manufacturing semiconductor materials in the state in which a compound semiconductor consisting of an element of at least one kind of mercury, cadmium, and zinc and an element of at least one kind of sulfur, selenium, and tellurium is being deposited onto a substrate under vacuum, said method comprising the step of:

simultaneously irradiating onto said substrate a beam of atoms or molecules of nitrogen at least a part of which are ionized or of molecules containing nitrogen or phosphorus or arsenic at least a part of which are ionized.

2. A method according to claim 1, wherein said compound semiconductor consists of zinc selenide, and said substrate consists of a monocrystal of gallium arsenide.

3. A method according to claim 1, wherein said compound semiconductor consists of zinc selenide, and said substrate consists of a monocrystal of zinc selenide.

4. A method according to claim 1, wherein said compound semiconductor consists of zinc sulpho-selenide of a composition ratio giving the same lattice constant as that of galium arsenide, and said substrate consists of a monocrystal of gallium arsenide.

5. A method according to claim 1, wherein an energy of ions is 500 eV or less.

6. A method according to claim 1, wherein a concentration of ions which are irradiated onto the substrate is not larger than 1/100 of the concentration of the deposition atoms which are deposited onto the substrate.

7. A method according to claim 2, wherein an energy of ions is 500 eV or less.

8. A method according to claim 2, wherein a concentration of ions which are irradiated onto the substrate is not larger than 1/100 of the concentration of the deposition atoms which are deposited onto the substrate.

9. A method according to claim 3, wherein an energy of ions is 500 eV or less.

10. A method according to claim 3, wherein a concentration of ions which are irradiated onto the substrate is not larger than 1/100 of the concentration of the deposition atoms which are deposited onto the substrate.

11. A method according to claim 4, wherein an energy of ions is 500 eV or less.

12. A method according to claim 4, wherein a concentration of ions which are irradiated onto the substrate is not larger than 1/100 of the concentration of the deposition atoms which are deposited onto the substrate.

13. A method according to claim 5, wherein a concentration of ions which are irradiated onto the substrate is not larger than 1/100 of the concentration of the deposition atoms which are deposited onto the substrate.

14. A method according to claim 7, wherein a concentration of ions which are irradiated onto the substrate is not larger than 1/100 of the concentration of the deposition atoms which are deposited onto the substrate.

15. A method according to claim 9, wherein a concentration of ions which are irradiated onto the substrate is not larger than 1/100 of the concentration of the deposition atoms which are deposited onto the substrate.

16. A method according to claim 11, wherein a concentration of ions which are irradiated onto the substrate is not larger than 1/100 of the concentration of the deposition atoms which are deposited onto the substrate.

17. A method of manufacturing semiconductor materials in the state in which a compound semiconductor consisting of an element of group II and an element of group VI is being deposited onto a substrate under vacuum, said method comprising the step of:

simultaneously irradiating onto said substrate a beam of atoms or molecules of nitrogen or phosphorus or arsenic at least a part of which were ionized or of molecules containing nitrogen or phosphorus or arsenic at least a part of which were ionized.

* * * * *